United States Patent
Baba et al.

(10) Patent No.: US 7,342,498 B2
(45) Date of Patent: Mar. 11, 2008

(54) RADIO FREQUENCY IDENTIFICATION (RFID) TAG AND MANUFACTURING METHOD THEREOF

(75) Inventors: Shunji Baba, Kawasaki (JP); Toru Maniwa, Kawasaki (JP); Takashi Yamagajo, Kawasaki (JP); Manabu Kai, Kawasaki (JP); Hiroyuki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 11/006,731

(22) Filed: Dec. 8, 2004

(65) Prior Publication Data

US 2006/0032926 A1 Feb. 16, 2006

(30) Foreign Application Priority Data

Aug. 13, 2004 (JP) ............... 2004-236155

(51) Int. Cl.
*G08B 13/14* (2006.01)
(52) U.S. Cl. .................. 340/572.5; 340/540; 340/10.1; 340/572.4; 29/825; 29/829; 343/700 R
(58) Field of Classification Search ............. 340/572.5, 340/540, 572.1, 568.1, 572.7, 572.8, 572.4, 340/10.1, 10.4; 29/825, 829; 343/700 R
See application file for complete search history.

(56) References Cited

U.S. PATENT DOCUMENTS

| | | | |
|---|---|---|---|
| 5,608,417 A * | 3/1997 | de Vall | 343/895 |
| 5,779,839 A * | 7/1998 | Tuttle et al. | 156/213 |
| 6,107,920 A * | 8/2000 | Eberhardt et al. | 340/572.7 |
| 6,265,977 B1 * | 7/2001 | Vega et al. | 340/572.7 |
| 6,375,780 B1 * | 4/2002 | Tuttle et al. | 156/226 |
| 6,563,463 B1 * | 5/2003 | Saito | 343/700 MS |
| 6,693,541 B2 * | 2/2004 | Egbert | 340/572.7 |
| 6,885,354 B2 * | 4/2005 | Takei | 343/870 |
| 7,055,754 B2 * | 6/2006 | Forster | 235/492 |

FOREIGN PATENT DOCUMENTS

| | | |
|---|---|---|
| CN | 1178073 C | 12/2004 |
| EP | 1 498 842 | 1/2005 |
| EP | 1 585 191 | 10/2005 |
| JP | 11-134459 | 5/1999 |
| JP | 2000-332523 | 11/2000 |
| JP | 2001-94322 | 4/2001 |
| JP | 2001-143029 | 5/2001 |
| JP | 2002-375568 * | 7/2004 |
| JP | 2004-206479 | 7/2004 |
| JP | 2004-215061 | 7/2004 |
| WO | 03/083770 | 10/2003 |
| WO | 03/098544 | 11/2003 |
| WO | 2004/030148 | 4/2004 |
| WO | 2005/078649 | 8/2005 |

OTHER PUBLICATIONS

Chinese office action issued Dec. 8, 2006 in corresponding CN 2004100821762.

* cited by examiner

*Primary Examiner*—Benjamin C. Lee
*Assistant Examiner*—Daniel Previl
(74) *Attorney, Agent, or Firm*—Staas & Halsey LLP

(57) ABSTRACT

An RFID tag includes a dielectric member, an antenna pattern formed on and around a surface of the dielectric member, and an IC chip that is electrically connected to the antenna pattern by means of two chip pads.

22 Claims, 15 Drawing Sheets

RADIO FREQUENCY IDENTIFICATION (RFID) TAG AND MANUFACTURING METHOD THEREOF

BACKGROUND OF THE INVENTION

1) Field of the Invention

The present invention relates to a radio frequency identification (RFID) tag such as a non-contact integrated circuit (IC) card, which receives power supply and information from, and transmits information to, an external device. The "RFID tag" used in the present invention is also known to one skilled in the art as an "RFID tag inlay", inlay being an internal constituent part (inlay) used in the "RFID tag". The "RFID tag" is also known as a "wireless IC tag".

2) Description of the Related Art

RFID tags such as a non-contact integrated circuit that receive using radio waves, power supply and information from an external device such as an IC card reader/writer and then transmit the received information to the external device contact-free are being used in recent years. A typical RFID tag includes an antenna pattern and an integrated circuit (IC) chip. The antenna pattern, which transmits and receives data, is mounted on a substrate made of plastic, paper, and the like. The antenna pattern and a capacity element built into the IC chip form a resonance circuit, and the RFID tag communicates via radio waves with the external device by means of the antenna pattern.

However, there may be instances where an RFID tag is used close to a wave-absorbing material such as a wine bottle or a human body. The wave-absorbing material poses a problem in the communication process since it absorbs the radio waves (for instance, radio waves in the ultra high frequency (UHF) band) that are required by the RFID tag for transmission and reception. FIG. 26 and FIG. 27 are drawings of conventional well-known means that enhance the gain of an antenna. FIG. 26 is a cross-sectional view of a conventional RFID tag in which a plane antenna is provided on the wave-absorbing material. FIG. 27 is a cross-sectional view of a conventional RFID tag in which a loop antenna is provided on the wave-absorbing material.

As shown in FIG. 26, a substrate 110 having a plane antenna 120 is fixed to a wave-absorbing material 100 by means of an adhesive 140. The plane antenna 120 is connected by means of a feeding point 130 to an IC chip (not shown) mounted on another substrate.

As a related conventional technology, the RFID tag with a plane coil antenna is well known (for instance, see Japanese Patent Laid-Open Publication No. 2004-206479). An RFID tag with a plane coil antenna includes a dielectric antenna substrate and an antenna coil. The antenna coil includes a first set of coils located on one surface of the antenna substrate and a second set of coils located on a second surface of the antenna substrate. The first set of coils and the second set of coils straddle the antenna substrate, each coil of the first set and each coil of the second set alternating with each other such that a portion of the two coils face each other. The first set of coils and the second set of coils are connected in a predetermined sequence.

As shown in FIG. 27, a loop antenna 160, which is in a sheet of a metal, is fixed on the wave-absorbing material 100 by means of the adhesive 140. The loop antenna 160 encloses a hollow interior 150 and is connected by means of the feeding point 130 to an IC chip (not shown) mounted on another substrate. The RFID loop antenna is widely used in pagers.

However, in a RFID tag with the plane antenna 110 shown in FIG. 26, an antenna pattern that has a small area can be employed. If the area of the antenna pattern is small, the communication distance is short. The wave-absorbing material 100 causes further degradation of antenna response because it absorbs the radio waves.

Similarly, the antenna response is affected and the communication distance also decreases significantly in the case of the RFID tag fabricated using a plane coil antenna disclosed in Japanese Patent Laid-Open Publication No. 2004-206479, since the wave-absorbing material 100 absorbs the radio waves.

However, in an RFID tag with a loop antenna 160 shown in FIG. 27, since the loop antenna 160 has a diameter, the antenna cannot be made slim. Therefore, the loop antenna can not be employed in small RFID tags.

Moreover, the loop antenna 160 may get crushed when subjected to external pressure since it has a hollow interior 150.

SUMMARY OF THE INVENTION

It is an object of the present invention to solve at least the problems in the conventional technology.

An RFID tag according to an aspect of the present invention includes a dielectric member; an antenna pattern formed on and around a surface of the dielectric member whereby the antenna pattern forms a loop; and an IC chip with a built-in communication circuit and a built-in memory circuit, the IC chip being electrically connected to the antenna pattern.

An RFID tag according to another aspect of the present invention includes a dielectric member; a film substrate that includes an antenna pattern, the film substrate being tied on and around the dielectric member whereby the antenna pattern forms a loop; and an IC chip with a built-in communication circuit and a built-in memory circuit, the IC chip being electrically connected to the antenna pattern.

An RFID tag according to still another aspect of the present invention includes a dielectric member; a dielectric member support that slidably supports the dielectric member; a film substrate that includes an antenna pattern, the film substrate being tied on and around the dielectric member whereby the antenna pattern forms a loop; and an IC chip with a built-in communication circuit and a built-in memory circuit, the IC chip being electrically connected to the antenna pattern.

An RFID tag manufacturing method according to still another aspect of the present invention includes mounting a film substrate having a transceiving antenna pattern on a surface of a dielectric member and forming a loop antenna; and electrically connecting an IC chip to the antenna pattern, the IC chip including at least a built-in communication circuit and a built-in memory circuit.

An RFID tag manufacturing method according to still another aspect of the present invention includes forming a loop antenna on a surface of a dielectric member by means of a transceiving antenna pattern; and electrically connecting an IC chip to the antenna pattern, the IC chip including a built-in communication circuit and a built-in memory circuit.

An RFID tag manufacturing method according to still another aspect of the present invention includes electrically connecting an IC chip to a first transceiving antenna pattern of a first film substrate, wherein the IC chip includes a built-in communication circuit and a built-in memory circuit; laminating a first surface of a dielectric member with the first film substrate such that the IC chip mounted on the first film substrate fits into a concavity provided on the dielectric member; laminating a second surface of the dielectric member with a second film substrate having a second transceiving antenna pattern; and electrically connecting the first transceiving antenna pattern of the first film substrate and the second transceiving antenna pattern of the second film substrate by means of a conductive member.

The other objects, features, and advantages of the present invention are specifically set forth in or will become apparent from the following detailed description of the invention when read in conjunction with the accompanying drawings.

DETAILED DESCRIPTION

Exemplary embodiments of a RFID tag and a manufacturing method thereof according to the present invention are explained next with reference to the accompanying drawings. The present invention is not limited to the present embodiment.

Figure 1:
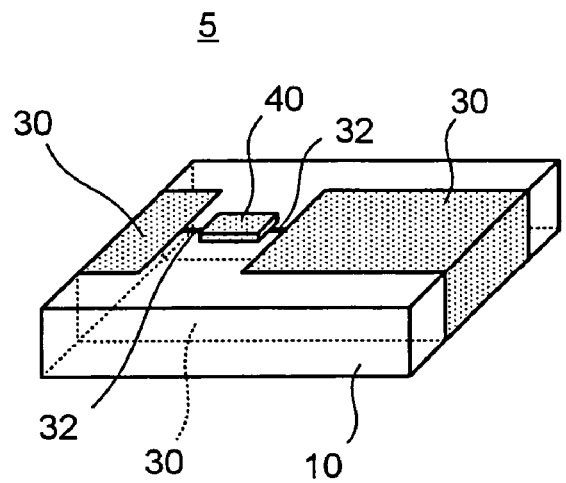
FIG. 1 is a perspective view of a RFID tag according to a first embodiment of the present invention.
Figure 2:
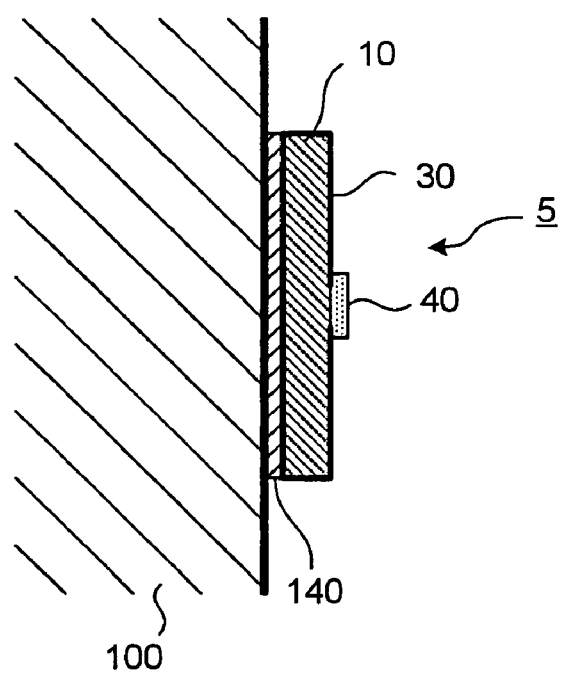
FIG. 2 is a cross-sectional view of the RFID tag mounted on a wave-absorbing material.
Figure 3:
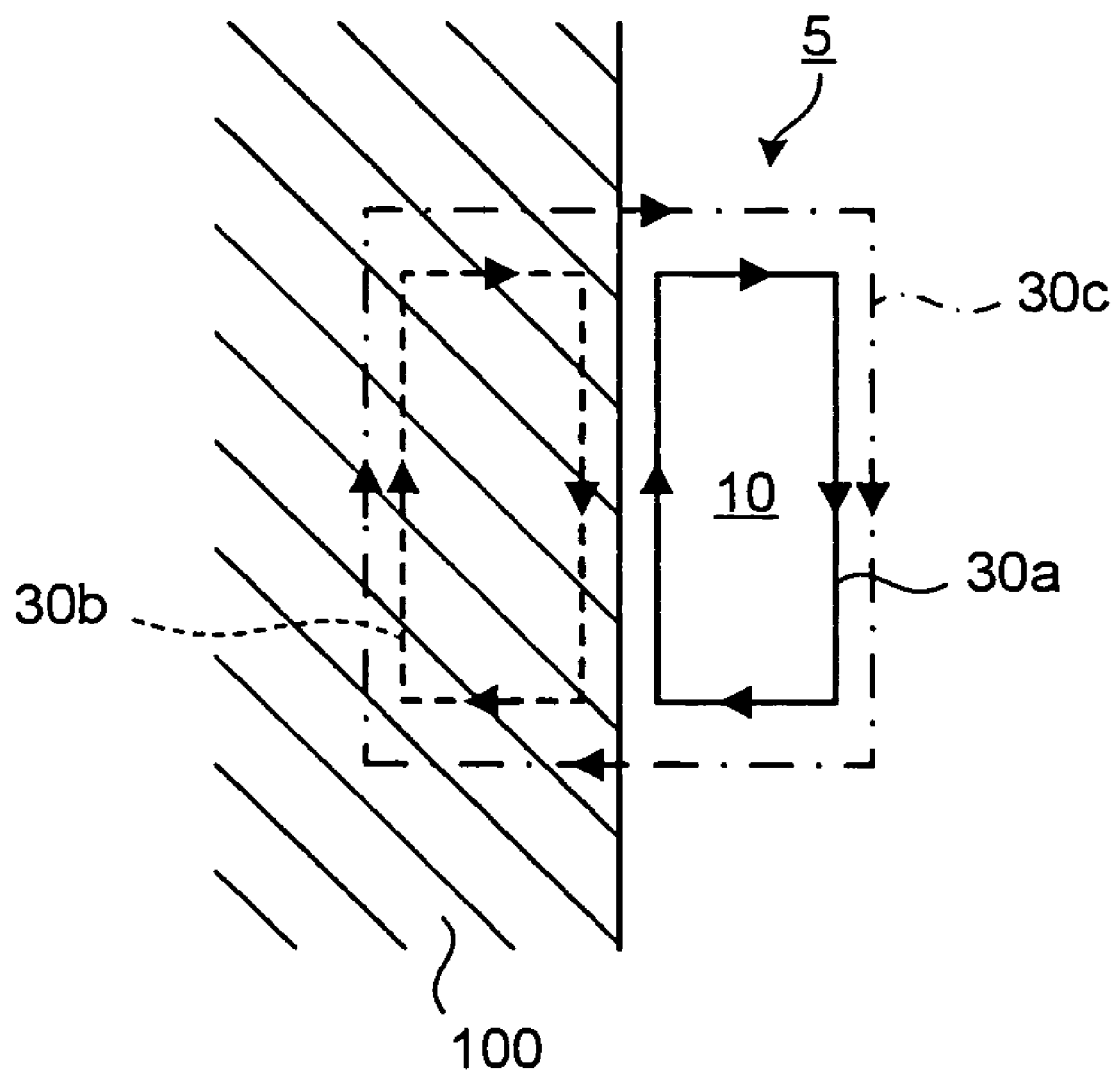
FIG. 3 is a schematic diagram that illustrates a principle of a formation of a large current loop.

FIG. 1 is a perspective view of the RFID tag-according to a first embodiment of the present invention. FIG. 2 is a cross-sectional view of the RFID tag mounted on a wave-absorbing material. FIG. 3 is a schematic diagram that illustrates a principle of the formation of a large current loop. As shown in FIG. 1 and FIG. 2, a RFID tag 5 according to the first embodiment of the present invention includes a rectangular dielectric member 10, an antenna pattern 30 that transmits and receives data, and an integrated circuit (IC) chip 40. The antenna pattern 30 is a loop antenna tied around the surface of the dielectric member 10. The IC chip 40 is electrically connected to the antenna pattern 30 via chip pads 32.

The rectangular dielectric member 10 is composed of a dielectric material having a certain dielectric constant, and may be a high frequency substrate composed of resin containing glass, etc. The antenna pattern 30 on the plane surface of the dielectric member 10 is formed by etching a conductor (for instance, a metallic conductor such as copper).

A pair of chip pads 32 on which an IC chip 40 is mounted and that electrically connect the IC chip 40 to the antenna pattern 30 is also formed by etching along with the antenna pattern 30. The antenna pattern 30 on the side surfaces (thickness of the dielectric member) of the dielectric member 10 is formed by a known side conduction method of plating.

The IC chip 40 includes a communication circuit that records and reads the information contact-free, a memory, and a designated control circuit. The IC chip 40 also includes chip electrodes that electrically connect the IC chip 40 to the chip pads 32 that extend to the antenna pattern 30. The control circuit may not necessarily be provided within the IC chip 40.

A manufacturing method of the RFID tag 5 is explained next. The antenna pattern 30 and the chip pads 32 are formed on the dielectric member 10 by etching process and the like to form a loop antenna (loop antenna formation step).

The IC chip 40 mounting step is carried out next. In other words, the IC chip 40 is mounted in such a way that the chip electrodes of the IC chip 40 are electrically connected to the chip pads 32. A flip chip mount can be used as a mounting means.

As shown in 2, the RFID tag 5 is secured on a wave-absorbing material 100 such as a wine bottle using the adhesive 140 (for instance, a two-sided tape) and is covered by a not shown specified protection film. The RFID tag 5 may be equipped beforehand with the protection film and the adhesive 140 in order to be secured to the article in which it is to be used.

The principle of the formation of a large current loop is explained next. The principle is the one by which the communication distance can be increased and is explained with reference to FIG. 3. The antenna pattern 30 forms a small loop antenna 30a around the dielectric member 10. The small loop antenna 30a also forms an image current 30b on the wave-absorbing material 100.

The small loop antenna 30a and the image current 30b form a large current loop 30c. The formation of the large current loop 30c enhances the transmission gain and significantly increases the communication distance. In other words, reduction of communication distance can be controlled. Moreover, since the antenna pattern 30 is formed on the dielectric member 10, the antenna pattern 30 does not get damaged even when it is subjected to external pressure.

The RFID tag 5 that has a structure as described above that can transmit accurate radio wave information due to enhanced transmission gain of the antenna when receiving power supply and information from and transmitting the received information to an external device (not shown) contact-free. As a result, the reliability of the data communication can be increased. Though a rectangular dielectric member 10 has been used in the RFID tag 5 according to the first embodiment, the dielectric member 10 may be of any shape (for instance, cylindrical, triangular prism, spherical, etc.) depending on the article it is intended for.

Figure 4:
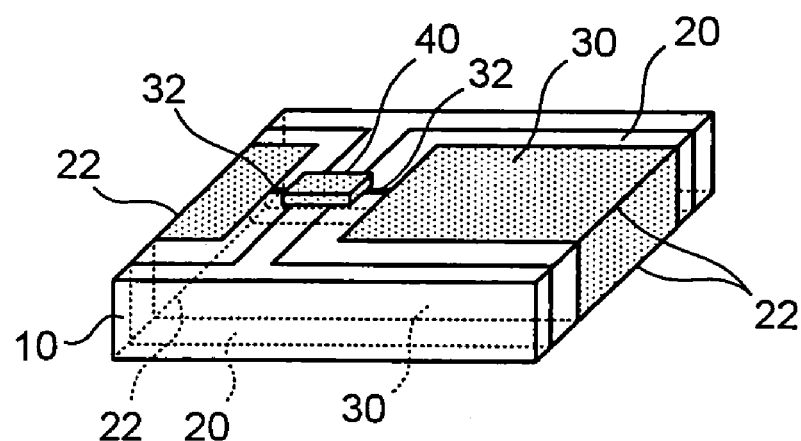
FIG. 4 is a perspective view of the RFID tag according to a second embodiment of the present invention.
Figure 5:
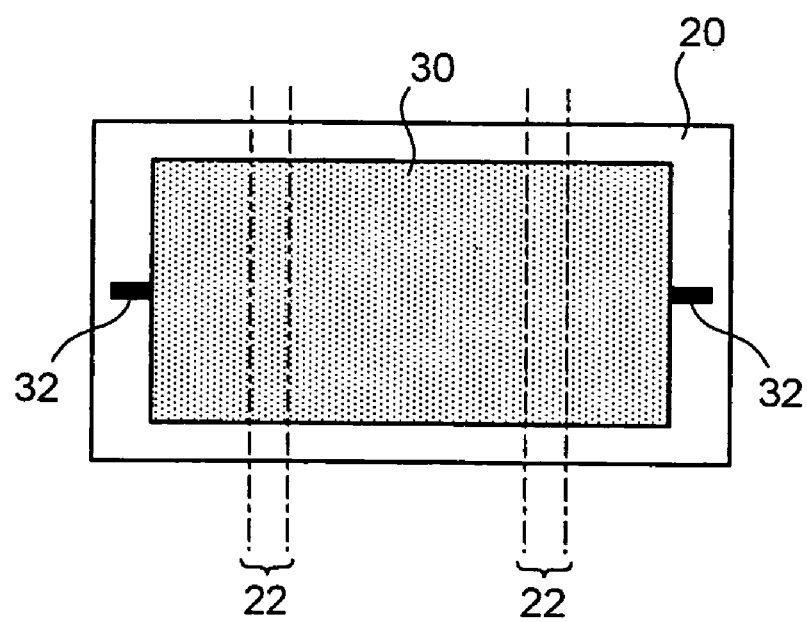
FIG. 5 is a top view of a film substrate shown in FIG. 4.

FIG. 4 is a perspective view of a RFID tag according to a second embodiment of the present invention. FIG. 5 is a top view of a film substrate. The parts in the second embodiment that are identical to those in the first embodiment are assigned the same reference numerals and their description is made very brief or skipped altogether.

As shown in FIG. 4, the RFID tag 5 according to the second embodiment of the present invention includes the dielectric member 10, a film substrate 20, and the IC chip 40. The film substrate 20 forms the antenna pattern 30 that transmits and receives data and is wrapped around the dielectric member 10. The IC chip 40 is connected to the antenna pattern 30.

The rectangular dielectric member 10 is composed of a dielectric material that has a designated dielectric constant and can be formed inexpensively using only glass-free resin. For instance, the dielectric member 10 can be formed with resin such as polytetrafluoroethylene (PTFE), polyphenylether (PPE), and the like, that have excellent processibility and mechanical properties.

As shown in FIG. 4 and FIG. 5, the antenna pattern 30 that forms the transceiving loop antenna is formed on the film substrate 20 by a printing means. The film substrate 20 is composed of a flexible thermoplastic material. Polyethylene terephthalate (hereinafter, "PET"), polyimide (PI), polyethylene naphthalate (PEN), and polyvinyl chloride (PVC) can be used as material for the film substrate 20.

Taking into account the processibility, insulative properties, mechanical strength, and the cost, PET is the most suitable material for the film substrate 20. The dimensions of the film substrate are in proportion to the dielectric member 10 such that the loop antenna can be formed by means of the antenna pattern 30.

The antenna pattern 30 is formed by silk screen printing a conductive paste over the film substrate 20. The film substrate 20 includes the chip pads 32 on which the IC chip 40 is connected and that electrically connect the IC chip 40 to the antenna pattern 30. The chip pads 32 are simultaneously formed along with the antenna pattern 30 by silk screen printing the conductive paste on the film substrate 20. Using the RFID tag 5 having a structure according to the second embodiment a larger current loop than by conventional technology can be obtained, resulting in increased communication distance. The principle of formation of the large current loop is the same as described in the first embodiment and hence not described here.

The manufacturing method of the RFID tag 5 is explained next. The film substrate 20 that includes the antenna pattern 30 is wrapped around the dielectric member 10 by bending at folds 22 corresponding to the edges of the dielectric member 10. The film substrate 20 is secured to the dielectric member 10 by means of an adhesive or a two-sided tape. The loop antenna is thus formed. This is the loop antenna formation step in the manufacturing method of the RFID tag 5.

The IC chip 40 mounting step is carried out next. In other words, the IC chip 40 is mounted in such a way that the chip electrodes of the IC chip 40 are electrically connected to the chip pads 32. A flip chip mount can be used as the mounting means.

Thus, apart from having an identical effect as the first embodiment, the RFID tag 5 according to the second embodiment of the present invention can be easily and inexpensively manufactured by wrapping the film substrate 20 that includes the antenna pattern 30 around the inexpensive dielectric member 10 having a good processibility and by mounting the IC chip 40 on the chip pads 32.

Though a rectangular dielectric member 10 has been used in the RFID tag 5 according to the first embodiment, apart from rectangular shape, the dielectric member 10 may be, for instance, cylindrical, triangular prism, spherical, etc., depending on the article it is intended for.

Figure 6:
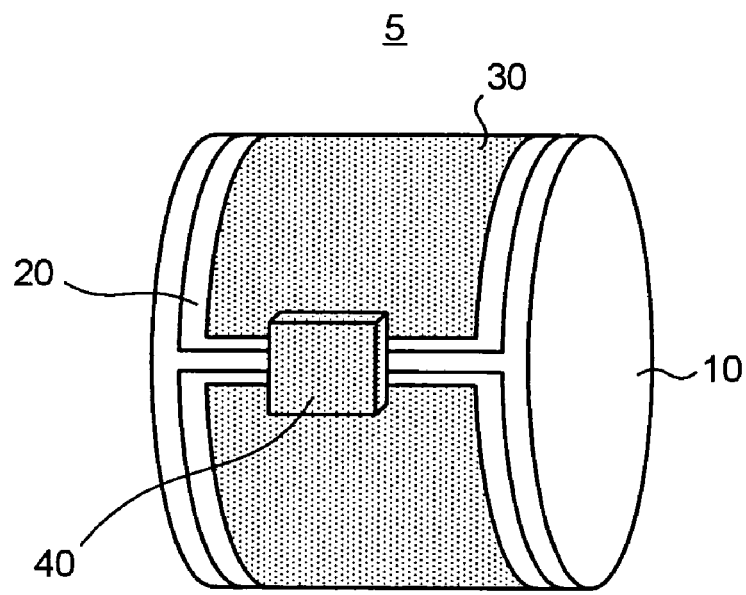
FIG. 6 is a perspective view of a modification of the RFID tag shown in FIG. 4.
Figure 7:
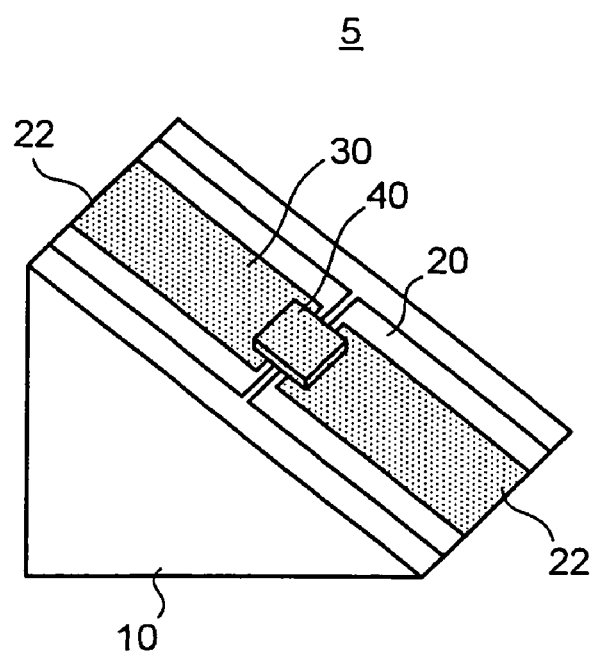
FIG. 7 is a perspective view of another modification of the RFID tag shown in FIG. 4.
Figure 8:
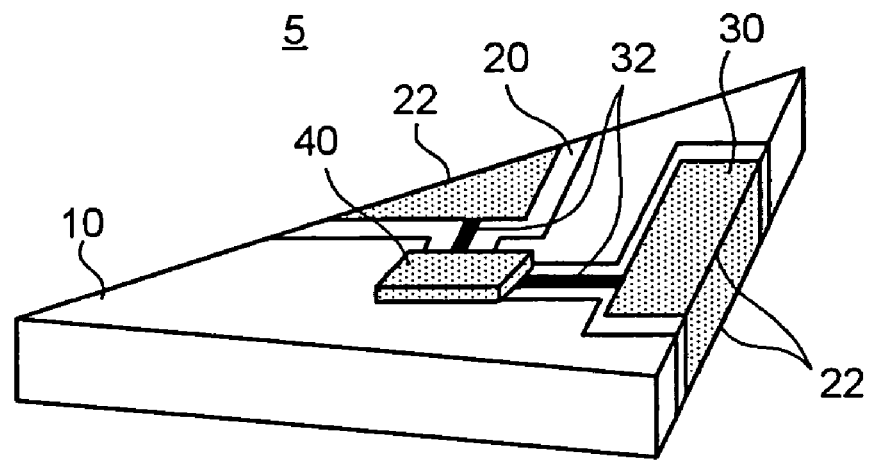
FIG. 8 is a perspective view of still another modification of the RFID tag shown in FIG. 4.

For instance, as shown in FIG. 6, the film substrate 20 may be wrapped around a cylindrical dielectric member 10. As shown in FIG. 7 and FIG. 8, the film substrate 20 may be wrapped around a triangular prism-shaped dielectric member 10. The effect produced in all the above case will be the same as for the second embodiment. FIG. 6, FIG. 7, and FIG. 8 are perspective views of RFID tags having different shapes.

Figure 9:
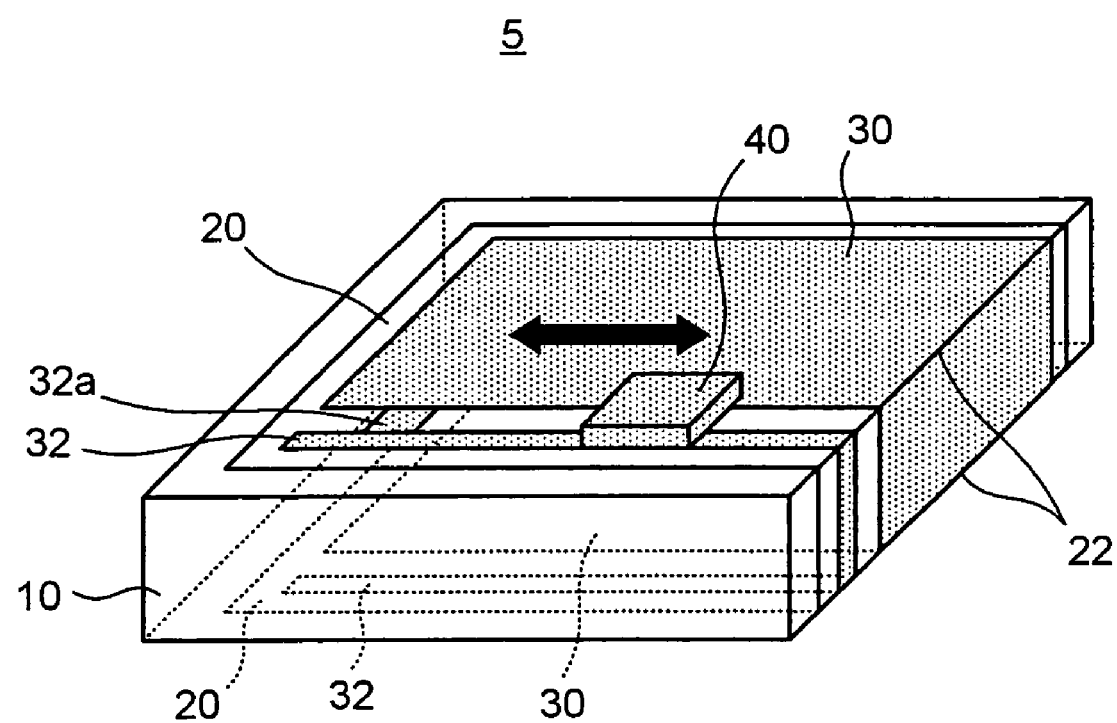
FIG. 9 is a perspective view of the RFID tag according to a third embodiment of the present invention.
Figure 10:
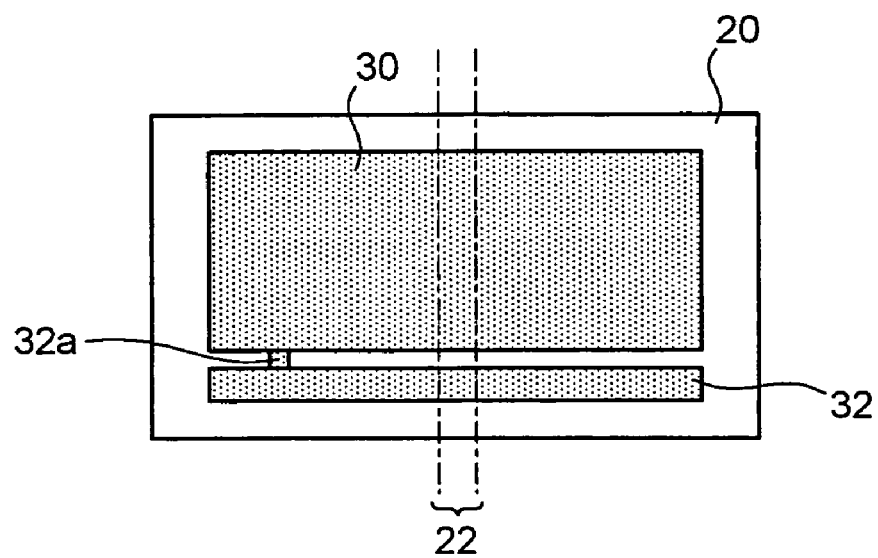
FIG. 10 is a top view of the film substrate shown in FIG. 9.

FIG. 9 is a perspective view of the RFID tag according to a third embodiment of the present invention. FIG. 10 is a top view of the film substrate. As shown in FIG. 9 and FIG. 10, the chip pad 32 is provided parallel to the length of the antenna pattern 30 in such a way that the position of the feeding point of the IC chip 40 can be adjusted.

In other words, the chip pad 32 is connected to the antenna pattern 30 by a connector 32a and is provided parallel to the antenna pattern 30. The chip pad 32 and the connector 32a are composed of the same material as the antenna pattern 30 and are simultaneously formed when the antenna pattern 30 is printed on the film substrate 20.

As shown in FIG. 9, the film substrate 20 is wrapped around and secured to the dielectric member 10 in such a way that the antenna pattern 30 functions as a patch antenna. The IC chip 40 is mounted after the film substrate 20 is secured to the dielectric member 10 and the position of the feeding point is adjusted.

In other words, the position of the feeding point is adjusted by electrically connecting the chip electrode of the IC chip 40 to the chip pad 32 and the antenna pattern 30, sliding the IC chip 40 along the length (that is, in the direction of the arrow shown in the drawing) of the chip pad 32, and changing the mounting location of the IC chip 40.

Once the position of the feeding point is adjusted, the IC chip 40 is mounted there. As in the second embodiment, a flip chip mount can be used as the mounting means.

Thus, apart from having an identical effect as the second embodiment, the RFID tag 5 according to the third embodiment of the present invention allows the antenna response to be adjusted by adjusting the position of the feeding point by changing the mounting location of the IC chip 40.

Figure 11:
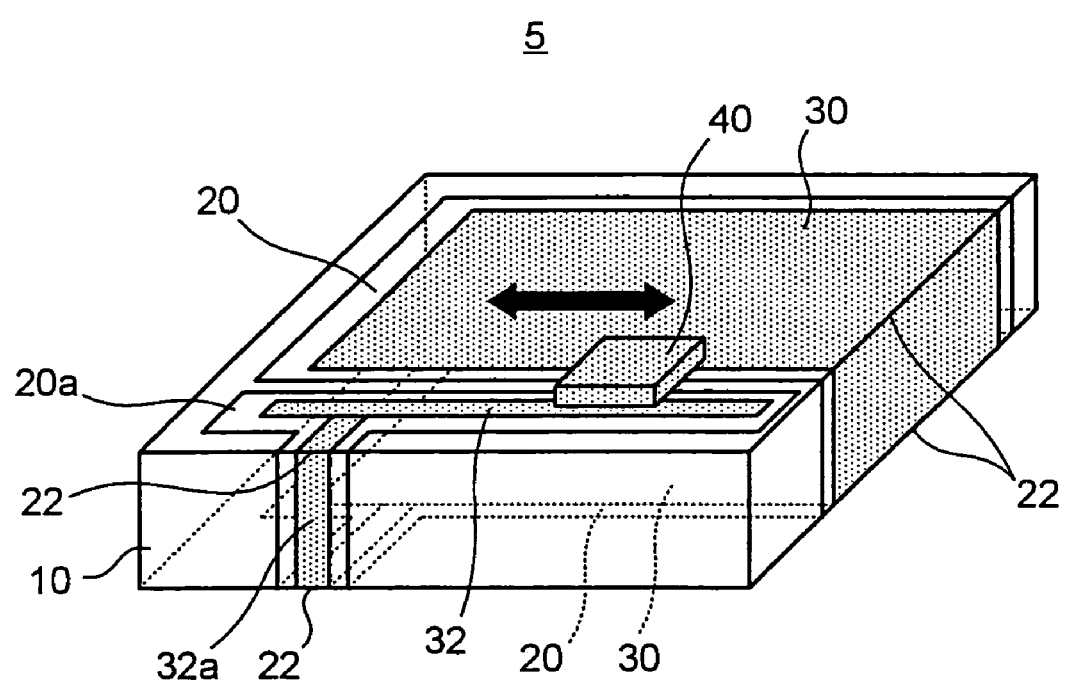
FIG. 11 is a perspective view of the RFID tag according to a fourth embodiment of the present invention.
Figure 12:
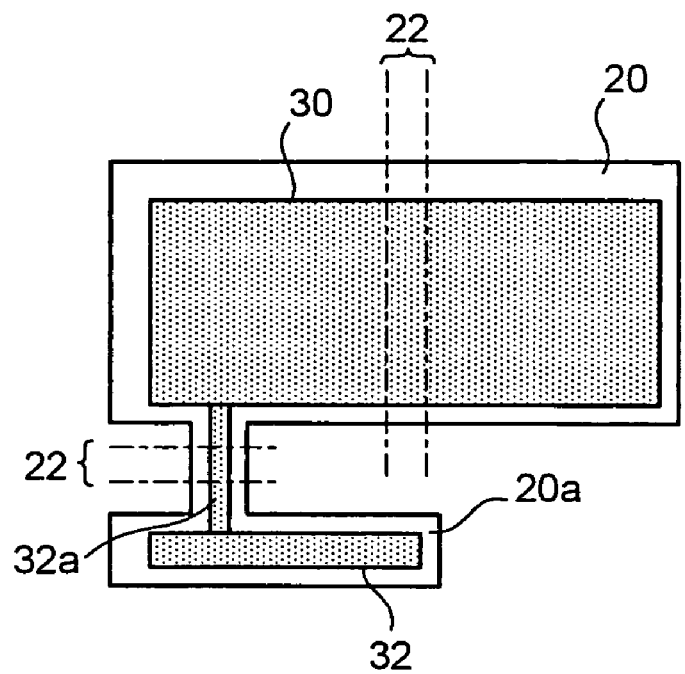
FIG. 12 is a top view of the film substrate shown in FIG. 12.

FIG. 11 is a perspective view of the RFID tag according to a fourth embodiment of the present invention. FIG. 12 is a top view of the film substrate. Though the antenna pattern 30 is actually on the underside of the film substrate 20, to facilitate explanation, the antenna pattern 30 is shown in FIG. 12 in X-ray view (that is, as appearing to be on the surface of the film substrate 20).

As in the third embodiment, in the fourth embodiment too the chip pad 32 is provided on the film substrate 20 in such a way that the position of the feeding point can be easily adjusted by changing the mounting location of the IC chip 40. In other words, as shown in FIG. 11 and FIG. 12, an inverted T-shaped film substrate extension 20a is provided from the film substrate 20 and the chip pad 32 is set on the film substrate extension 20a along the length of and parallel to the antenna pattern 30 in such a way that the position of the feeding point of the IC chip 40 to the antenna pattern 30 can be adjusted.

As shown in FIG. 11, the film substrate 20 and the film substrate extension 20a are wrapped around and secured to the dielectric member 10 in such a way that the antenna pattern 30 functions as a patch antenna. The rest of the structure of the RFID tag and the method of adjustment of the mounting location of the IC chip 40 are identical to those according to the third embodiment and hence are not described here.

Thus, apart from having an identical effect as the second embodiment, the RFID tag 5 according to the fourth embodiment of the present invention allows the antenna response to be adjusted by adjusting the position of the feeding point by changing the mounting location of the IC chip 40.

Figure 13:
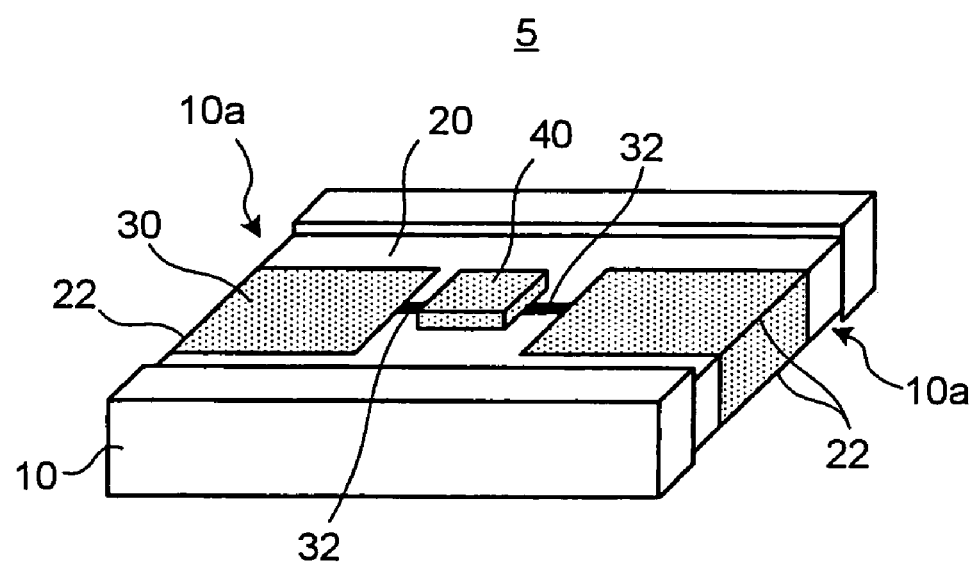
FIG. 13 is a perspective view of the RFID tag according to a fifth embodiment of the present invention.

FIG. 13 is a perspective view of the RFID tag according to a fifth embodiment of the present invention. In the fifth embodiment, a depressed portion 10a is provided on a surface of the dielectric member 10 and the film substrate 20 is fit in it. This configuration facilitates alignment of the film substrate 20 with the dielectric member 10.

The depth of the depressed portion 10a is substantially equal to the sum of the thickness of the film substrate 20 and the thickness of the IC chip 40. In other words, the surface of the mounted IC chip 40 sits in the depressed portion 10a without jutting out of the surface of the dielectric member 10. The rest of the structure and the manufacturing method of the RFID tag 5 is identical to that of the RFID tag 5 according to the second embodiment, and hence are not described here.

Thus, apart from having an identical effect as the second embodiment, the RFID tag 5 according to the fifth embodiment of the present invention allows the film substrate 20 to be easily aligned with the dielectric member 10 by providing the depressed portion 10a on the dielectric member 10.

Since the surface of the mounted IC chip 40 sits in the concave portion 10a and does not jut out of the surface of the dielectric member 10, when secured to an article such as a wave-absorbing material and is covered with the protection film the RFID tag 5 remains safe without any pressure being transferred to it. Consequently, the durability of the RFID tag 5 against external pressure is enhanced.

Further, this flat RFID tag 5 is ideal for using on the inner lining of clothing and apparel since it does not poke when coming in contact with the body.

The fifth embodiment can be applied to all the embodiments that follow (in case of a ninth embodiment, which is described later, a depressed portion having the same functions as the depressed portion 10a may be provided on a dielectric member support 60, which is described later). However, all the embodiments produce the same effect.

Figure 14:
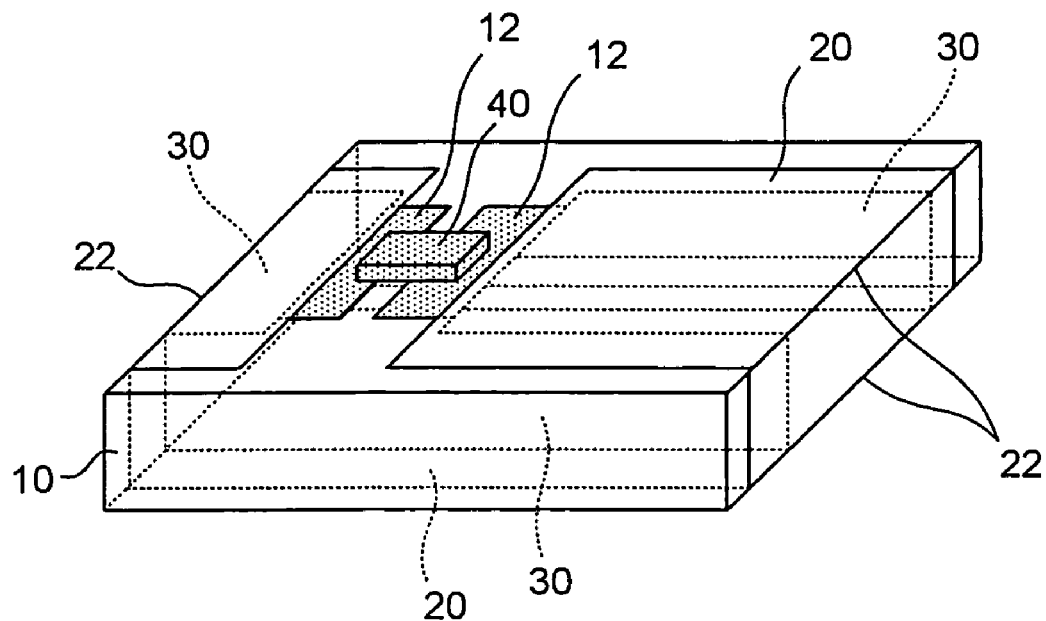
FIG. 14 is a perspective view of the RFID tag according to a sixth embodiment of the present invention.
Figure 15:
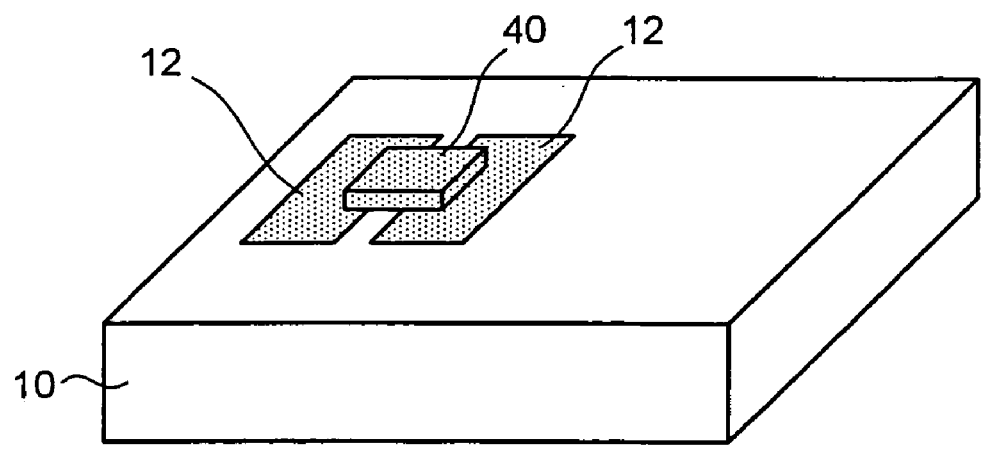
FIG. 15 is a perspective view of the RFID tag in which an IC chip is mounted on chip pads formed on a dielectric member.

FIG. 14 is a perspective view of the RFID tag according to a sixth embodiment of the present invention. FIG. 15 is a perspective view of the RFID tag in which the IC chip is mounted on the chip pads formed on the dielectric member. As shown in FIG. 15, in the RFID tag 5 according to the fifth embodiment of the present invention, chip pads 12 are already provided on the side of the dielectric member 10 and the IC chip 40 is mounted on the chip pads 12. As shown in FIG. 14, the film substrate 20 is wrapped around the dielectric member 10 in such a way that the antenna pattern 30 printed on the bottom surface (underside) of the film substrate 20 is electrically connected to the chip pads 12.

The chip pads 12 can be formed on the dielectric member 10 by etching copper, by printing a conductive ink, or by pasting a conductive material. The connection of the chip pads 12 to the antenna pattern 30 and securing of one to the other can be done by applying a conductive adhesive (silver paste) on the contact surfaces of the chip pads 12 and the antenna pattern 30 and then applying pressure and heat on the portion. The mounting method of the IC chip 40 and the wrapping method of the film substrate 20 are identical to those according to the second embodiment, and hence are not described here.

Thus, apart from having an identical effect as the second embodiment, the RFID tag 5 according to the sixth embodiment of the present invention allows the selection of the film substrate 20 that includes the antenna pattern 30 most suited to the mounted IC chip 40, thus enabling adjustment of the transmission and reception response.

Figure 16:
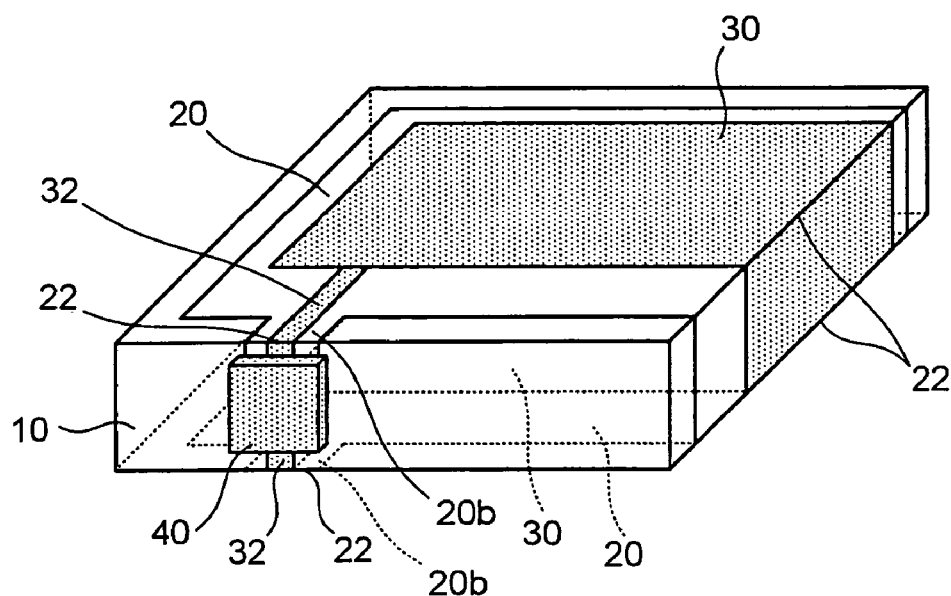
FIG. 16 is a perspective view of the RFID tag according to a seventh embodiment of the present invention.
Figure 17:
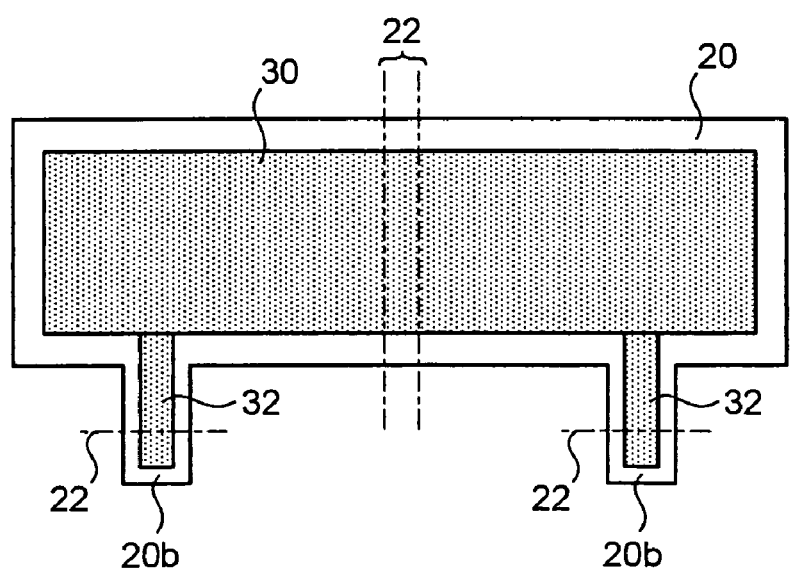
FIG. 17 is a top view of the film substrate shown in FIG. 16.

FIG. 16 is a perspective view of the RFID tag according to a seventh embodiment of the present invention. FIG. 17 is a top view of the film substrate. As shown in FIG. 16, the IC chip 40 is mounted on a side surface of the dielectric member 10. In other words, the IC chip 40 is mounted in such a location that a bulge due to the presence of the IC chip 40 is avoided in the largest plane portion of the RFID tag 5.

Thus, as shown in FIG. 17, the film substrate 20 is formed in such a way that the IC chip 40 can be mounted on the side surface of the dielectric member 10. In other words, when the film substrate 20 is wrapped around the dielectric member 10, a pair of film substrate extensions 20b of the film substrate 20 and a pair of chip pads 32 extend towards a side of the dielectric member 10.

The chip pads 32 are printed on the film substrate extensions 20b in continuity with the antenna pattern 30. The mounting method of the IC chip 40 and the wrapping method of the film substrate 20 are identical to those according to the second embodiment, they are not described here.

Thus, apart from having an identical effect as the second embodiment, the RFID tag 5 according to the seventh embodiment, the IC chip 40 is mounted on a side surface of the dielectric member 10. Consequently, a bulge due to the presence of the IC chip 40 is avoided in the largest plane portion of the RFID tag 5.

Further, as in the fifth embodiment, setting the IC chip 40 on the side surface makes the RFID tag 5 safe without any pressure being transferred to it when secured to an article and covered with the protection film. Consequently, the durability of the RFID tag 5 against external pressure is enhanced. Further, this flat RFID tag 5 is ideal for using on the inner lining of clothing and apparel since it does not poke when coming in contact with the body.

Though a rectangular dielectric member 10 has been used in the RFID tag 5 according to the seventh embodiment, the dielectric member 10 may be of any shape (for instance, cylindrical, triangular prism, spherical, etc.) depending the article it is intended for.

Figure 18:
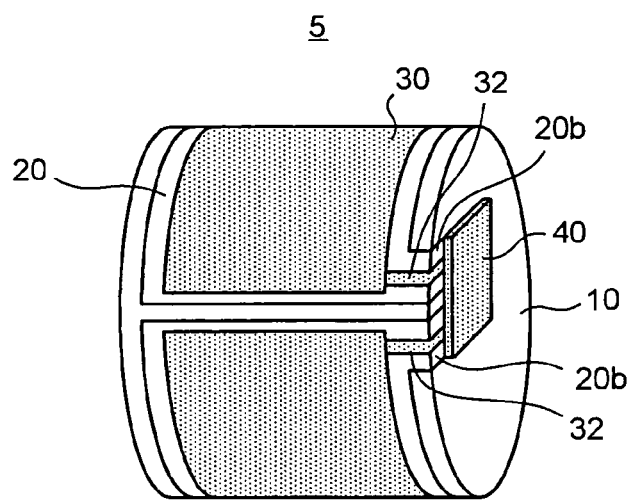
FIG. 18 is a perspective view of a modification of the RFID tag shown in FIG. 16.

For instance, as shown in FIG. 18, the film substrate 20 may be wrapped around a cylindrical dielectric member 10 and the IC chip 40 is provided on the disk portion of the cylinder. FIG. 18 is a perspective view of an RFID tag having a different shape.

Figure 19:
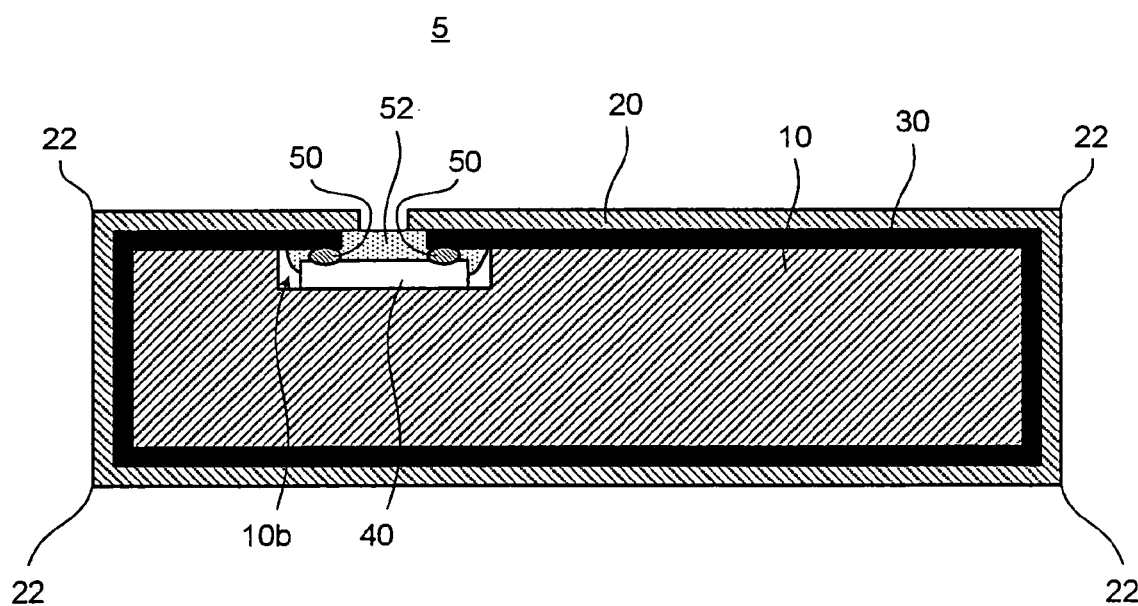
FIG. 19 is a cross-sectional view of the RFID tag according to an eighth embodiment of the present invention.

FIG. 19 is a perspective view of the RFID tag according to an eighth embodiment of the present invention. In the RFID tag 5 according to the eighth embodiment of the present invention, a concavity 10b into which the IC chip 40 can be accommodated is provided on the dielectric member 10 and the IC chip 40 is set in the concavity 10b. The film substrate 20 is wrapped around the dielectric member 10 in such a way that and the IC chip 40 is electrically connected to the antenna pattern 30 formed on the underside of the film substrate 20. In other words, the RFID tag 5 is fabricated in such a way that the IC chip 40 does not jut out of the surface of the RFID tag 5.

Bumps 50 are provided on the chip electrodes (not shown) of the IC chip 40. The IC chip 40 is fixed to the bottom of the concavity 10b, with the bumps 50 facing upward, by means of a thermosetting adhesive or an instant adhesive. The IC chip 40 is covered with an underfill 52 so as to keep the IC chip 40 and the bumps 50 securely held and protected. The film substrate 20 is wrapped and secured around the dielectric member 10 in such a way that the antenna pattern 30 and the bumps 50 of the IC chip 40 are electrically connected.

The connection of the bumps 50 with the antenna pattern 30 and the securing of one to the other can be done by applying the conductive adhesive (silver paste) on the contact surfaces of the bumps 50 and the antenna pattern 30 and then applying pressure and heat on the portion.

Thus, apart from having an identical effect as the second embodiment, the RFID tag 5 according to the eighth embodiment of the present invention has a plane surface since the IC chip 40 fits inside the concavity 10b of the dielectric member 10

Further, as in the fifth embodiment, accommodating the IC chip 40 makes the RFID tag 5 safe without any pressure being transferred to it when secured to an article and covered with the protection film. Consequently, the durability of the RFID tag 5 against external pressure is enhanced. Further, this flat RFID tag 5 is ideal for using on the inner lining of clothing and apparel since it does not poke when coming in contact with the body.

In the eighth embodiment, the film substrate 20 is wrapped around the dielectric member 10 in such a way that the concavity 10b is in aligned against the length edge of the film substrate 20. However, the film substrate 20 may be wrapped around the dielectric member 10 in such a way that the concavity 10b is in aligned against the width edge of the film substrate 20.

Figure 20:
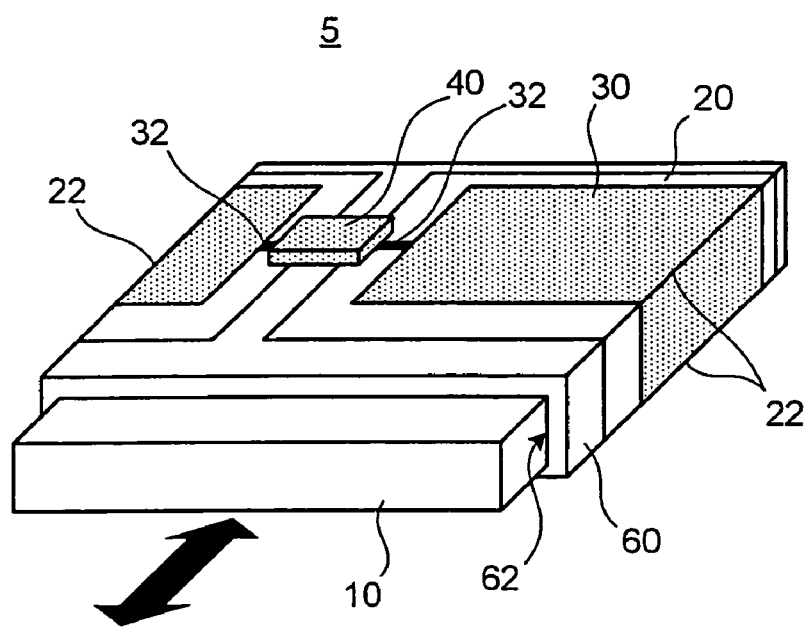
FIG. 20 is a perspective view of the RFID tag according to a ninth embodiment of the present invention.
Figure 21:
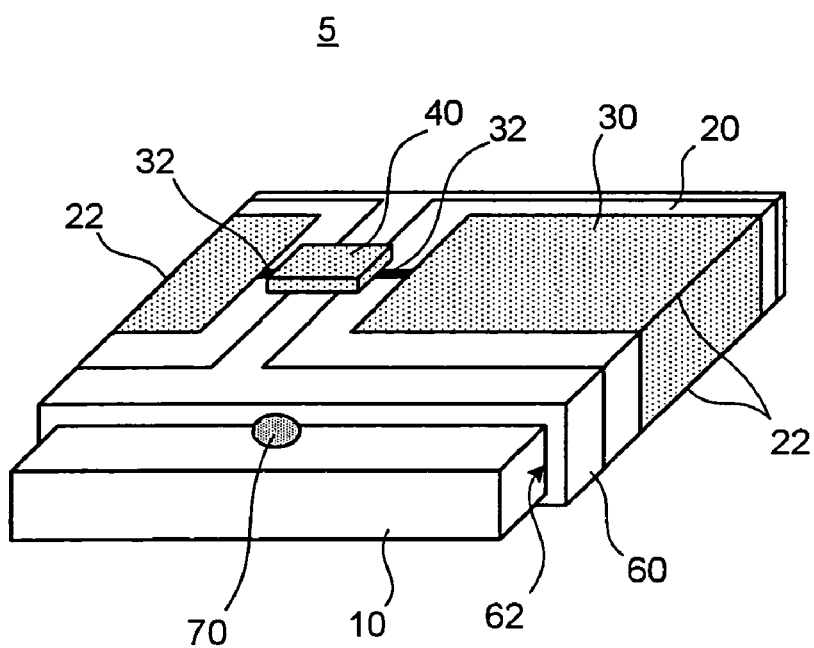
FIG. 21 is a perspective view of the RFID tag in which the dielectric member is secured to a dielectric member support.

FIG. 20 is a perspective view of the RFID tag according to the ninth embodiment of the present invention. FIG. 21 is a perspective view of the RFID tag in which the dielectric member is secured to a dielectric member support. As shown in FIG. 20, the RFID tag 5 according to the ninth embodiment includes the dielectric member 10, the dielectric member support 60 that slidably supports the dielectric member 10, the film substrate 20 that is wrapped around the surface of the dielectric member 10 and including the antenna pattern 30, and the IC chip 40 that is electrically connected to the antenna pattern 30.

The dielectric member support 60, which may be composed of resin, such as plastic, has a slot 62 for sliding the dielectric member 10 in and out of. The dielectric constant of the dielectric member is adjusted by sliding the dielectric member 10 in the dielectric member support 60 in the direction of the arrow shown in FIG. 20. The response of the antenna can be adjusted easily by adjusting the dielectric constant.

As shown in FIG. 21, the dielectric member 10 and the dielectric member support 60 are secured with an adhesive 70 to maintain the position of the adjusted dielectric member 10. As shown in FIG. 21, the dielectric member 10 can be secured by applying the adhesive 70 on edge at the opening of the slot 62. The adhesive may be applied inside the slot 62 instead of at the opening.

Further, a notch means may be used as a securing means wherein a lug and notches that engage into each other may be provided and the position of engagement may be changed by application of a certain degree of external pressure. The mounting method of the IC chip 40 and the wrapping method of the film substrate 20 are identical to those described in the second embodiment, and hence are not described here.

Thus, apart from having an identical effect as the second embodiment, the RFID tag 5 according to the ninth embodiment of the present invention allows adjustment of the dielectric constant, and hence the response of the antenna, by sliding the dielectric member 10 in and out of the dielectric member support 60.

Moreover, the RFID tag can be easily inactivated (that is, communication can be disabled). To inactivate the RFID tag 5 all a user needs to do is remove the adhesive 70 and remove the dielectric member 10 from the dielectric member support 60.

Figure 22:
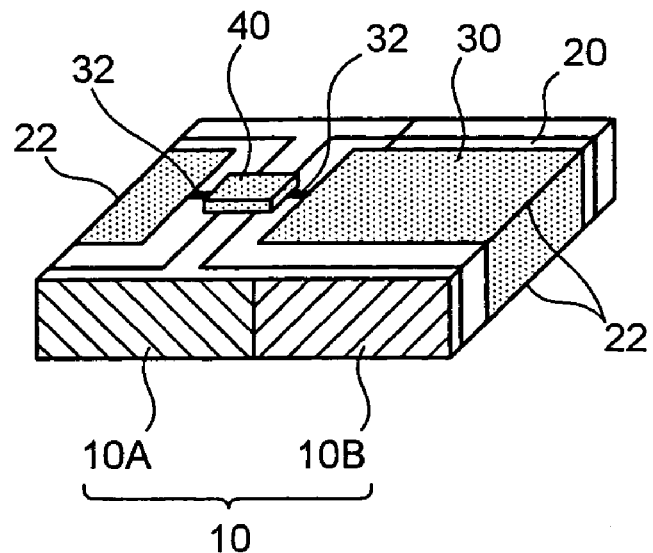
FIG. 22 is a perspective view of the RFID tag according to a tenth embodiment of the present invention.

FIG. 22 is a perspective view of the RFID tag according to a tenth embodiment of the present invention. The dielectric member 10 is composed of a plurality of dielectric members 10A and 10B that have different dielectric constants and dielectric losses in order to adjust the dielectric constant and a dielectric loss.

For instance, when the dielectric member 10A with a high dielectric constant and dielectric loss and the dielectric member 10B with a low dielectric constant and dielectric loss are combined (the dielectric members 10A and 10B are integrated by gluing them together), the dielectric member 10 with intermediate properties can be obtained.

The dielectric members 10A and 10B are combined horizontally in FIG. 22. However, the dielectric members 10A and 10B may also be combined vertically (that is, in the thickness direction of the dielectric members). The mounting method of the IC chip 40 and the wrapping method of the film substrate 20 are identical to those described in the second embodiment, and hence not described here.

Thus, apart from having an identical effect as the second embodiment, the RFID tag 5 according to the tenth embodiment of the present invention allows adjustment of the dielectric constant and the dielectric loss, and hence the response of the antenna, by using the dielectric member 10 formed by combing dielectric members 10A and 10B having different dielectric constants and dielectric losses.

The tenth embodiment can also be applied to first through eighth embodiments as well as a twelfth embodiment described later to produce identical effect.

Figure 23:
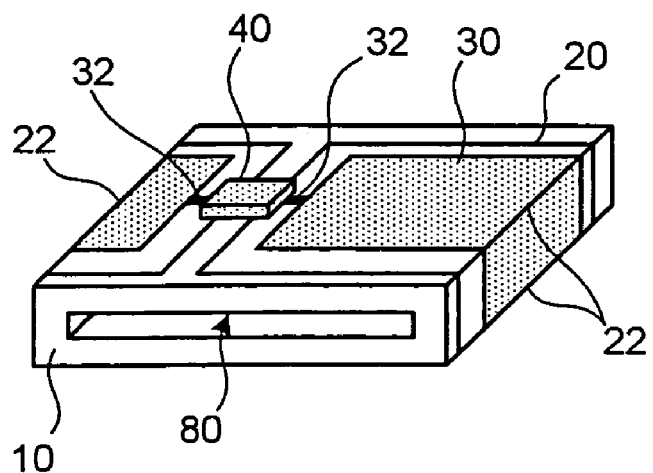
FIG. 23 is a perspective view of the RFID tag according to an eleventh embodiment of the present invention.

FIG. 23 is a perspective view of the RFID tag according to an eleventh embodiment of the present invention. The RFID tag 5 according to the eleventh embodiment has a structure similar to the RFID tag 5 according to the second embodiment except that the dielectric member 10 has an airspace 80. The airspace 80 is a vacant space that forms a layer of air of predetermined thickness within the dielectric member 10. In other words, the dielectric constant in the dielectric member 10 can be reduced and set to the desired value by the dielectric constant of the air in the airspace 80.

Thus, apart from having an identical effect as the second embodiment, the RFID tag 5 according to the eleventh embodiment of the present invention allows antenna response to be easily adjusted by adjusting the dielectric constant of the dielectric member 10 by increasing or decreasing the airspace 80 within the dielectric member 10.

The eleventh embodiment is explained by taking the RFID tag 5 according to the second embodiment and providing the airspace 80 in the dielectric member 10. It is also possible to provide the airspace 80 in the dielectric member 10 of the RFID tag 5 according to any of the first embodiment, third to eighth embodiments, and the twelfth embodiment explained next.

Figure 24:
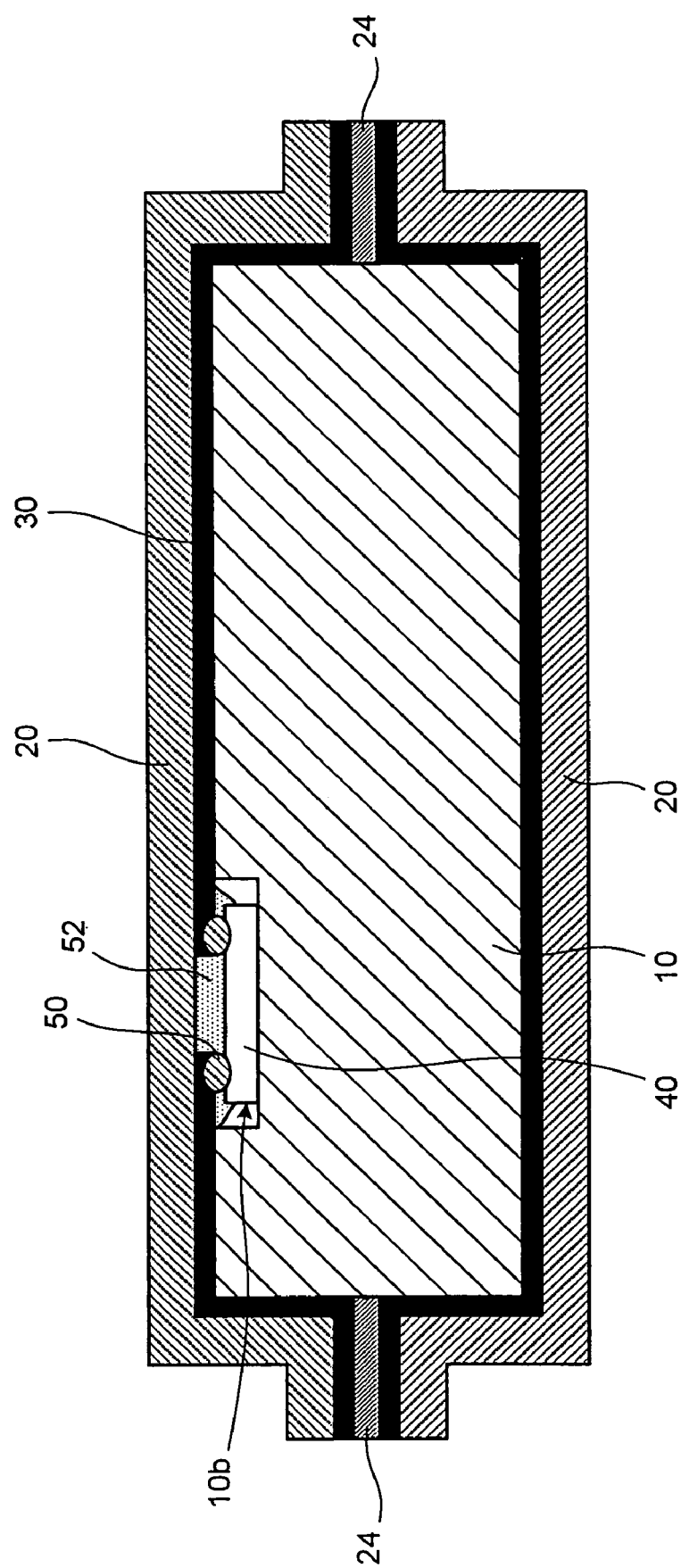
FIG. 24 is a cross-sectional view of the RFID tag according to a twelfth embodiment of the present invention.
Figure 25:
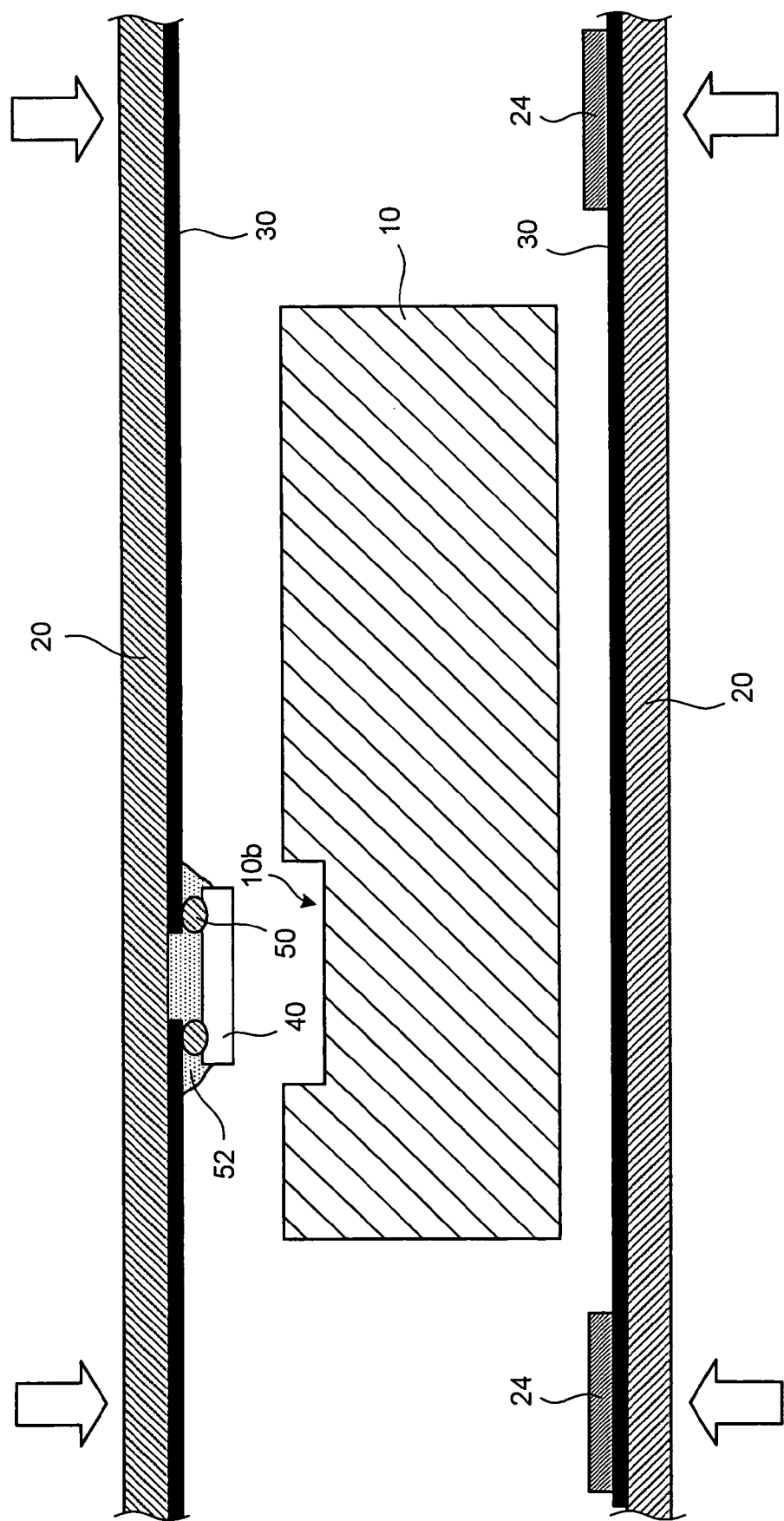
FIG. 25 is a cross-sectional view of the RFID tag to illustrate a lamination step.
Figure 26:
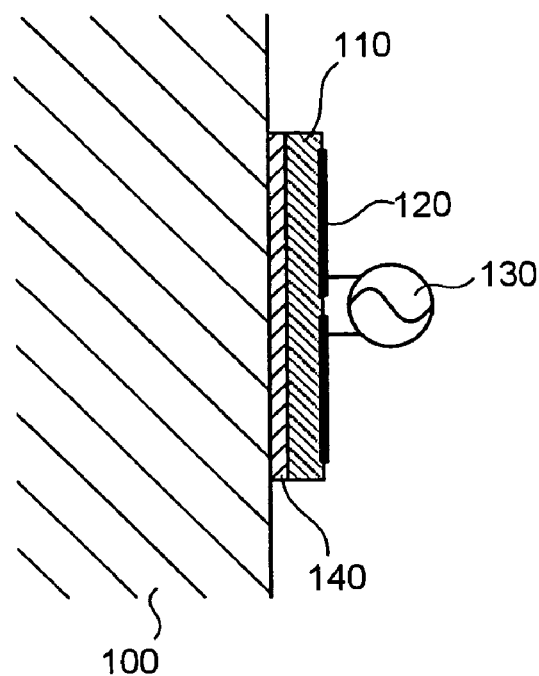
FIG. 26 is a cross-sectional view of a conventional RFID tag with a plane antenna.
Figure 27:
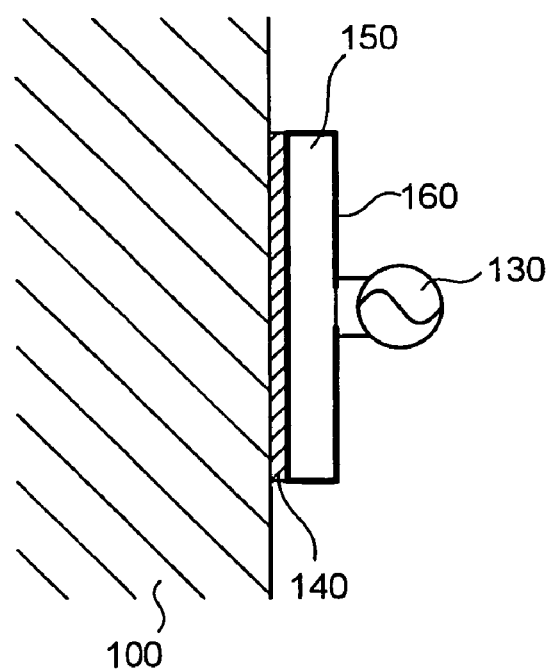
FIG. 27 is a cross-sectional view of a conventional RFID tag with a loop antenna.

FIG. 24 is a cross-sectional view of the RFID tag according to a twelfth embodiment of the present invention. FIG. 25 is a cross-sectional view of the RFID tag to illustrate a lamination step. In the eighth embodiment of the present invention, the RFID tag 5 is formed by mounting the IC chip 40 on the concavity 10b of the dielectric member 10 and a single sheet of the film substrate 20 is wrapped around the dielectric member 10 to form folds 22, as shown in FIG. 19.

However, in the twelfth embodiment, the RFID tag 5 is fabricated by laminating the surface and the underside of the dielectric member 10 by two separate film substrates 20, as shown in FIG. 24 and FIG. 25.

In other words, the manufacturing method of the RFID tag 5 includes two steps, namely the IC chip mounting process and the lamination process. The IC chip mounting process involves electrically connecting the antenna pattern 30 of a first film substrate 20 to the IC chip 40. The lamination process involves fixing the first film substrate 20 on the surface (a first surface) of the dielectric member 10 in such a way that the IC chip 40 sits in the concavity 10b of the dielectric member 10, fixing a second film substrate 20 on the underside (a second surface) of the dielectric member 10, and forming the loop antenna by electrically connecting the two antenna patterns 30 of two film substrates 20 by means of a conductive adhesive (conductive member) 24, such as silver paste.

The flip chip mount can be used in the IC chip mounting step. The lamination of the two film substrates 20 and the connection of the antenna patterns 30 in the lamination step are carried out by applying pressure and heat on the portion having the conductive adhesive 24, as indicated by the arrows in FIG. 25. Though not shown, adhesive is used on the contact surfaces of the dielectric member 10 and the film substrate 20 other than in the portions where the conductive adhesive 24 is provided.

Thus, apart from having an identical effect as the eighth embodiment, the lamination of the film substrates 20 and the connection of the antenna patterns 30 in the lamination step in the RFID tag 5 according to the twelfth embodiment of the present invention can be done more easily than wrapping the film substrate 20 around the dielectric member 10 as in the eighth embodiment.

Since the IC chip 40 is laminated by the film substrates 20, the need to provide a special lamination (protection film) to protect the RFID tag 5 is obviated, reducing the number of components.

According to the present invention, a loop antenna is formed on a surface of a dielectric member. Consequently, the transmission gain of the antenna can be enhanced and communication distance can be increased. Moreover, since an antenna pattern is formed around the dielectric member, the antenna pattern does not get damaged even when subjected to external pressure, ensuring a reliable communication.

According to the present invention, a film substrate is provided that forms the loop antenna by virtue of being mounted on the surface of the dielectric member. Consequently, the loop antenna can be formed easily and inexpensively, the transmission gain of the loop antenna can be enhanced, and the communication distance can be increased. Further, since the film substrate, which includes the antenna pattern, is formed on the dielectric member, the antenna pattern does not get damaged even when subjected to external pressure, ensuring a reliable communication.

According to the present invention, the mounting of an IC chip and its connection to the antenna pattern can be realized simultaneously and with ease.

According to the present invention, the mounting of an IC chip and its connection to the antenna pattern can be realized simultaneously and with ease.

According to the present invention, the mounted IC chip sits inside a concavity provided in the dielectric member without jutting out of the surface of the dielectric member. Consequently, the IC chip remains safe against external pressure and the RFID tag is not easily damaged.

According to the present invention, the surfaces other than the side surface on which the IC chip is mounted are plane. Consequently, the IC chip remains safe against external pressure and the RFID tag is not easily damaged.

According to the present invention, the position of a feeding point can be adjusted easily by changing the mounting location of the IC chip on the chip pad. Consequently, the response of the antenna can be adjusted.

According to the present invention, the response of the antenna can be easily adjusted by sliding the dielectric member in and out of a dielectric member support.

According to the present invention, the antenna response can be adjusted by adjusting the dielectric constant and the dielectric loss by combining a plurality of dielectric members having different dielectric constants and dielectric losses.

According to the present invention, the loop antenna can be easily formed by mounting the film substrate on the surface of the dielectric member using a loop antenna formation step. The RFID can be easily and inexpensively manufactured by mounting the IC chip on the loop antenna using an IC chip mounting step.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An RFID tag comprising:
    a dielectric member substrate;
    an RFID tag antenna formed on two or more surfaces of the dielectric member substrate surrounding the dielectric member substrate in a loop shape, by means of etching and plating; and
    an IC chip with a built-in communication circuit and a built-in memory circuit, the IC chip being electrically connected to the antenna, such that the tag has increased communication, effective range, decreased tag size, and reduced interference from an attachment surface.

2. The RFID tag according to claim 1, wherein the dielectric member substrate includes a plurality of dielectric members having different dielectric constants and dielectric losses.

3. The REID tag according to claim 1, wherein the dielectric member substrate includes an airspace.

4. An RFID tag comprising:
a dielectric member substrate;
a film substrate that includes an RFID tag antenna, the film substrate being wrapped around two or more surfaces of the dielectric member substrate surrounding the dielectric member substrate to form a loop; and
an IC chip with a built-in communication circuit and a built-in memory circuit, the IC chip being electrically connected to the antenna, such that the tag has increased communication, effective range, decreased tag size, and reduced interference from an attachment surface.

5. The RFID tag according to claim 4, wherein the film substrate include a chip pad for electrically connecting the IC chip to the antenna.

6. The RFID tag according to claim 5, wherein the chip pad extends to a side surface of the dielectric member substrate and the IC chip is mounted on the side surface.

7. The RFID tag according to claim 5, wherein the chip pads are provided along a length of the antenna in such a way that a position of a feeding point of the IC chip can be adjusted.

8. The RFID tag according to claim 4, wherein the dielectric member substrate includes a chip pad for electrically connecting the IC chip to the antenna pattern.

9. The REID tag according to claim 4, wherein the dielectric member substrate includes a concavity for accommodating the IC chip.

10. The RFID tag according to claim 9, comprising a plurality of the film substrates, wherein the film substrates are laminated on the surface of the dielectric member substrate, and antenna of respective film substrates being electrically connected by means of a conductive member.

11. The REID tag according to claim 4, wherein the dielectric member substrate includes a depressed portion for accommodating the film substrate.

12. The RFID tag according to claim 11, wherein the depressed portion has a depth such that the IC chip does not jut out above a surface of the dielectric member substrate in a portion other than the depressed portion.

13. The REID tag according to claim 4, wherein the dielectric member substrate includes a plurality of dielectric members having different dielectric constants and dielectric losses.

14. The REID tag according to claim 4, wherein the dielectric member substrate includes an airspace.

15. An RFID tag comprising:
a dielectric member substrate;
a dielectric member substrate support that slidably supports the dielectric member substrate;
a film substrate that includes an RFID tag antenna, the film substrate being wrapped around surfaces of the dielectric member substrate surrounding the dielectric member substrate to form a loop; and
an IC chip with a built-in communication circuit and a built-in memory circuit, the IC chip being electrically connected to the antenna, such that the tag has increased communication, effective range, decreased tag size, and reduced interference from an attachment surface.

16. The RFID tag according to claim 15 further comprising a dielectric member substrate securing member with which the dielectric member substrate can be secured after a position of the dielectric member substrate in the dielectric member substrate support is adjusted.

17. The RFID tag according to claim 15, wherein the dielectric member substrate support includes a concavity for accommodating the film substrate.

18. The RFID tag according to claim 15, wherein the dielectric member substrate includes a plurality of dielectric members having different dielectric constants and dielectric losses.

19. The RFID tag according to claim 15, wherein the dielectric member substrate includes an airspace.

20. An RFID tag manufacturing method comprising:
wrapping a film substrate having a RFID tag transceiving antenna around two or more surfaces of a dielectric member substrate surrounding the dielectric member substrate to form a loop antenna; and
electrically connecting an IC chip to the antenna, the IC chip including at least a built-in communication circuit and a built-in memory circuit, such that the tag has increased communication, effective range, decreased tag size, and reduced interference from an attachment surface.

21. An RFID tag manufacturing method comprising:
forming a RFID tag loop antenna on two or more surfaces of the dielectric member substrate surrounding the dielectric member substrate in a loop shape, by means of etching and plating a transceiving antenna; and
electrically connecting an IC chip to the antenna, the IC chip including a built-in communication circuit and a built-in memory circuit, such that the tag has increased communication, effective range, decreased tag size, and reduced interference from an attachment surface.

22. An RFID tag manufacturing method comprising:
electrically connecting an IC chip to a RFID tag first transceiving antenna of a first film substrate, wherein the IC chip includes a built-in communication circuit and a built-in memory circuit;
laminating a first surface of a dielectric member substrate with the first film substrate such that the IC chip mounted on the first film substrate fits into a concavity provided on the dielectric member substrate;
laminating a second surface of the dielectric member substrate with a second film substrate having a second transceiving antenna; and
electrically connecting the first transceiving antenna of the first film substrate and the second transceiving antenna of the second film substrate by means of a conductive member, such that the tag has increased communication, effective range, decreased tag size, and reduced interference from an attachment surface.

* * * * *

UNITED STATES PATENT AND TRADEMARK OFFICE
CERTIFICATE OF CORRECTION

PATENT NO. : 7,342,498 B2  
APPLICATION NO. : 11/006731  
DATED : March 11, 2008  
INVENTOR(S) : Shunji Baba et al.

It is certified that error appears in the above-identified patent and that said Letters Patent is hereby corrected as shown below:

Column 13, Line 5 Claim 3, change "REID" to --RFID--.

Column 13, Line 31 Claim 8, after "antenna" delete "pattern." and insert --.--.

Column 13, Line 32 Claim 9, change "REID" to --RFID--.

Column 13, Line 40 Claim 11, change "REID" to --RFID--.

Column 13, Line 47 Claim 13, change "REID" to --RFID--.

Column 13, Line 51 Claim 14, change "REID" to --RFID--.

Column 14, Line 5 Claim 15, after "claim 15" insert --,--.

Signed and Sealed this

Twenty-ninth Day of July, 2008

JON W. DUDAS  
*Director of the United States Patent and Trademark Office*